United States Patent
Chand et al.

(10) Patent No.: US 12,532,664 B2
(45) Date of Patent: Jan. 20, 2026

(54) SEMICONDUCTOR SUBSTRATES, FABRICATION METHODS THEREOF AND MICRO-ELECTRO-MECHANICAL SYSTEM (MEMS) DEVICES

(71) Applicant: Vanguard International Semiconductor Corporation, Hsinchu (TW)

(72) Inventors: Rakesh Chand, Singapore (SG); Muniandy Shunmugam, Singapore (SG); Ramachandramurthy Pradeep Yelehanka, Singapore (SG)

(73) Assignee: Vanguard International Semiconductor Corporation, Hsinchu (TW)

( * ) Notice: Subject to any disclaimer, the term of this patent is extended or adjusted under 35 U.S.C. 154(b) by 1052 days.

(21) Appl. No.: 17/539,206

(22) Filed: Dec. 1, 2021

(65) Prior Publication Data

US 2023/0172068 A1    Jun. 1, 2023

(51) Int. Cl.
*H01L 41/23* (2013.01)
*B81B 7/00* (2006.01)
*H10N 30/02* (2023.01)
*H10N 30/20* (2023.01)
*H10N 30/30* (2023.01)
*H10N 30/85* (2023.01)

(52) U.S. Cl.
CPC ............ *H10N 30/02* (2023.02); *B81B 7/0032* (2013.01); *H10N 30/20* (2023.02); *H10N 30/302* (2023.02); *H10N 30/85* (2023.02); *B81B 2201/0235* (2013.01); *B81B 2201/0242* (2013.01); *B81B 2201/0271* (2013.01)

(58) Field of Classification Search
CPC ....... H10N 30/302; H10N 30/20; H10N 30/85
See application file for complete search history.

(56) References Cited

U.S. PATENT DOCUMENTS

| | | | | |
|---|---|---|---|---|
| 2015/0298965 | A1* | 10/2015 | Tsai | B81B 3/0029 438/51 |
| 2015/0357375 | A1* | 12/2015 | Tsai | H10N 30/302 257/416 |
| 2018/0370790 | A1* | 12/2018 | Cheng | B81C 1/00301 |
| 2019/0119102 | A1* | 4/2019 | Oja | G01L 9/0072 |
| 2021/0050506 | A1* | 2/2021 | Xia | H10N 30/708 |

FOREIGN PATENT DOCUMENTS

| | | |
|---|---|---|
| CN | 103407958 | 11/2013 |
| TW | 201436068 A | 9/2014 |

* cited by examiner

*Primary Examiner* — Bryan P Gordon
(74) *Attorney, Agent, or Firm* — Winston Hsu (57) ABSTRACT

A method of fabricating a semiconductor substrate includes the following steps. A first wafer is provided and a first surface of the first wafer is etched to form a plurality of cavities. A second wafer is formed on the first surface, where forming the second wafer includes the following steps: providing a core substrate; forming a first insulating layer on the core substrate; and depositing a polysilicon layer on the first insulating layer and the core substrate. In addition, the polysilicon layer is bonded with the first wafer to cover the cavities, where the polysilicon layer is disposed between the first insulating layer and the first wafer. In addition, a semiconductor substrate and MEMS devices using the semiconductor substrate are also provided.

11 Claims, 6 Drawing Sheets

SEMICONDUCTOR SUBSTRATES, FABRICATION METHODS THEREOF AND MICRO-ELECTRO-MECHANICAL SYSTEM (MEMS) DEVICES

BACKGROUND OF THE INVENTION

1. Field of the Invention

The present disclosure relates generally to semiconductor substrates, and more particularly to semiconductor substrates including a polysilicon layer on a wafer having cavities, fabrication methods thereof and MEMS devices using the semiconductor substrates.

2. Description of the Prior Art

Recently, micro-electro-mechanical systems (MEMS) devices are an enabling technology and have gained increased attention from multiple industries. A MEMS device may include a movable part and at least one other element, such as a pressure sensor, an actuator, or a resonator that is formed using a micromachining process that selectively etches away parts of a wafer. The wafer may include added structural layers and may be made of a semiconductor material, such as silicon.

Silicon-on-insulator (SOI) wafers may be used as substrates for MEMS devices. A silicon-on-insulator (SOI) wafer includes a thin silicon layer, a handle wafer, and a buried oxide layer. The buried oxide layer is sandwiched between the thin silicon layer and the handle wafer for physically separating and electrically isolating the thin silicon layer from the handle wafer. For MEMS devices using the SOI wafer as a substrate, the thin silicon layer of the SOI wafer may be processed to constitute a movable part of the MEMS device, such as a cantilever or suspended membrane. Alternatively, MEMS devices may use a bonded wafer instead of the SOI wafer as a substrate. The bonded wafer may be a stack structure including a device wafer and a handle wafer, and the device wafer may be thinned by performing a grinding process on the device wafer until the thinned device wafer reach a required thickness. The thinned device wafer, which is a thin layer, with a required thickness may be further processed to constitute a movable part of the MEMS device, such as a cantilever or suspended membrane.

However, it is difficult to precisely control the thickness of the thin silicon layer of an SOI wafer or to precisely control the thickness of the thinned device wafer, which negatively affects the electrical performance of the MEMS devices across the wafer. Besides, SOI wafers are costly, and the manufacturing processes for an SOI wafer are time-consuming. Thus, there is a need of a semiconductor substrate for MEMS devices to overcome the aforementioned problems.

SUMMARY OF THE INVENTION

In view of this, embodiments of the present disclosure provide improved semiconductor substrates that provide a polysilicon device layer with precise thickness and resistivity control. Moreover, methods of fabricating semiconductor substrates are also provided, which are less time-consuming and have more fabrication flexibility than using an SOI wafer. In addition, MEMS devices using the semiconductor substrates are provided, which have better device performances due to precise thickness and resistivity control of the polysilicon device layer.

According to one embodiment of the present disclosure, a method of fabricating a semiconductor substrate is provided and includes the following steps. A first wafer is provided and a first surface of the first wafer is etched to form a plurality of cavities. A second wafer is formed on the first surface, where forming the second wafer includes the following steps: providing a core substrate; forming a first insulating layer on the core substrate; and depositing a polysilicon layer on the first insulating layer and the core substrate. In addition, the polysilicon layer is bonded with the first wafer to cover the plurality of cavities, where the polysilicon layer is disposed between the first insulating layer and the first wafer.

According to one embodiment of the present disclosure, a micro-electro-mechanical system (MEMS) device is provided and includes a supporting substrate, an adhesion layer, a polysilicon device layer and a MEMS structure. The supporting substrate has a cavity on an upper surface, where the cavity does not penetrate through the supporting substrate. The adhesion layer is conformally disposed on the upper surface of the supporting substrate and sidewalls and the bottom surface of the cavity. The polysilicon device layer is disposed on the upper surface of the supporting substrate to cover the cavity. The MEMS structure is disposed on the polysilicon device layer.

According to one embodiment of the present disclosure, a semiconductor substrate is provided and includes a first wafer having a plurality of cavities on an upper surface, where bottom surfaces of the plurality of cavities are higher than a bottom surface of the supporting substrate, and a second wafer bonded with the first wafer to cover the plurality of cavities. The second wafer includes a core substrate, a polysilicon layer wrapping around the core substrate, and a first insulating layer disposed between the core substrate and the polysilicon layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features may not be drawn to scale. In fact, the dimensions of the various features may be arbitrarily increased or reduced for clarity of discussion.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "under", "on", "over", "above", "upper", "bottom", "top" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" and/or "under" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first", "second", and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that may vary as desired.

The present disclosure is directed to semiconductor substrates and fabrication methods thereof, and micro-electro-mechanical system (MEMS) devices using the semiconductor substrates. The semiconductor substrate includes a first wafer having a plurality of cavities and a second wafer bonded with the first wafer to cover the cavities. The second wafer includes a polysilicon layer wrapping around a core substrate and a first insulating layer disposed between the core substrate and the polysilicon layer. The polysilicon layer of the second wafer has precise thickness and resistivity control. Therefore, the MEMS devices using the semiconductor substrates of the present disclosure have better device performances than those using an SOI wafer. Moreover, the fabrication of the semiconductor substrates according to embodiments of the present disclosure is less time-consuming, less fabrication cost, good process parameter control and more fabrication flexibility than those using an SOI wafer.

Figure 1:
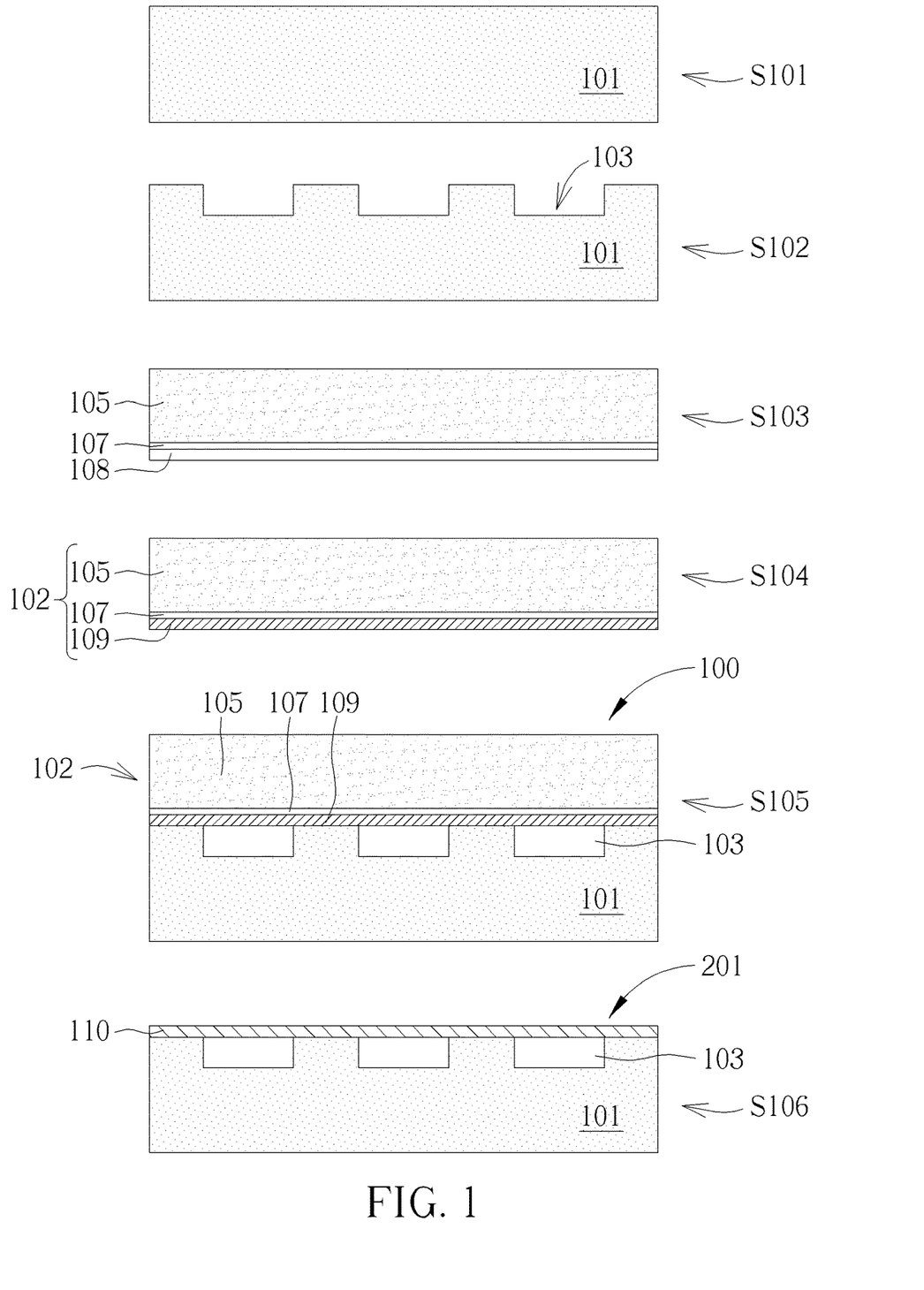
FIG. 1 shows schematic cross-sectional diagrams of several stages of a method of fabricating a semiconductor substrate and treating the semiconductor substrate for MEMS devices according to one embodiment of the present disclosure.

According to some embodiments of the present disclosure, methods of fabricating semiconductor substrates are provided. FIG. 1 shows schematic cross-sectional diagrams of several stages of a method of fabricating a semiconductor substrate 100 and treating the semiconductor substrate 100 to form a substrate 201 for MEMS devices according to one embodiment of the present disclosure. Referring to FIG. 1, first, at step S101, a first wafer 101 such as a Si wafer or other suitable semiconductor wafer is provided. The first wafer 101 includes a single crystal semiconductor material, such as silicon (Si), sapphire or other suitable semiconductor materials, for example elementary semiconductors such as such as Ge; compound semiconductors such as GaN, SiC, GaAs, GaP, InP, InAs, and/or InSb; alloy semiconductors such as SiGe, GaAsP, AlInAs, AlN, AlGaAs, GaInAs, GaInP, GaInAsP, or a combination thereof. Then, at step S102, the first wafer 101 is etched to form a plurality of cavities 103 on the upper surface thereof. The bottom surfaces of the cavities 103 are higher than the bottom surface of the first wafer 101, which means that the cavities do not penetrate through the supporting substrate. In one embodiment, the cavities 103 may have a right angle which means the angle between the sidewall and the bottom surface of the cavities 103 is about 90°. In some embodiments of the present disclosure, each of the cavities 103 has a cross-sectional shape such as a rectangle, a trapezoid, an inverted trapezoid or other suitable shapes. The depth of the cavities 103 is adjusted based on the requirements of devices using the semiconductor substrate 100. Besides, the number of the cavities 103 shown in FIG. 1 is for illustrative purpose only, the actual number of the cavities 103 of the first wafer 101 may be beyond 100 depending on the actual requirements. The cavities 103 may be formed by using a patterned mask disposed on the first wafer 101 as an etching mask and performing an etching process to remove portions of the first wafer 101 exposed by openings of the patterned mask. The etching process may be a dry etching or a wet etching process. The shapes and the dimensions of the cavities 103 are adjusted by the parameters of the etching process and the patterned mask based on the requirements of MEMS devices. For example, each cavity 103 may be a circle or polygon with the diameter or the length of diagonal of from about 50 μm to 2 mm, but not limited thereto.

Next, at step S103, a core substrate 105 of a second wafer 102 is provided. The core substrate 105 may be a semiconductor substrate such as a Si wafer, silicon-containing substrate or other suitable semiconductor substrates. In some embodiments, the material of core substrate 105 may be the same with the first wafer 101, but not limited thereto. Subsequently, a first insulating layer 107 is formed on one surface of the core substrate 105. The first insulating layer 107 may be a silicon oxide layer formed by a thermal oxidation or a deposition process. Thereafter, a polysilicon layer 108 is deposited on the first insulating layer 107 and the core substrate 105. The polysilicon layer 108 may be formed by a chemical vapor deposition (CVD) process such as an atmospheric pressure chemical vapor deposition (APCVD) process, a low-pressure chemical vapor deposition (LPCVD) process, or other suitable processes. In some embodiments, the thickness of the deposited polysilicon layer 108 may be well-controlled by adjusting the fabrication parameters and conditions and may be from about 2 μm to about 15 μm or thicker. According to different requirements, the first insulating layer 107 and the polysilicon layer 108 may be formed sequentially in different fabrication processes or in the same fabrication process. For example, the first insulating layer 107 may be formed on the core substrate 105 at the initial stage of forming the polysilicon layer 108.

Afterwards, at step S104, the deposited polysilicon layer 108 is treated by a polishing process to obtain a mirror-polished polysilicon layer 109, the polishing process is for example a wet polishing process, a chemical mechanical planarization (CMP) process, etc., but not limited thereto. In some embodiments, the thickness of the mirror-polished polysilicon layer 109 may be from about 1 μm to about 10 μm. At step S104, in some embodiments, a second wafer 102 includes the core substrate 105, the first insulating layer 107 and the mirror-polished polysilicon layer 109. The first insulating layer 107 and the mirror-polished polysilicon layer 109 are formed on the same surface of the core substrate 105. The polishing process may adjust the surface roughness of the mirror-polished polysilicon layer 109 and provide a better film quality for a device layer of MEMS devices. Even though the deposited polysilicon layer 108 is treated with the polishing process, the average thickness of the mirror-polished polysilicon layer 109 are the same as or slightly less than (e.g. difference in thickness is less than 5%) the average thickness of the deposited polysilicon layer 108.

Next, at step S105, the second wafer 102 is bonded with the first wafer 101 to cover the cavities 103 to obtain the semiconductor substrate 100, where the mirror-polished polysilicon layer 109 is disposed between the first insulating layer 107 and the first wafer 101. Subsequently, at step S106, the semiconductor substrate 100 is treated to completely remove the core substrate 105 and the first insulating layer 107. In some embodiments, the core substrate 105 and the first insulating layer 107 may be removed by a back grind (BG) process or a chemical mechanical planarization (CMP) process. As a result, the mirror-polished polysilicon layer 109 extending across the entire first wafer 101 is remained on the first wafer 101 to be a polysilicon device layer 110 covering the cavities 103, and then a substrate 201 is obtained for fabricating MEMS devices.

According to some embodiments of the present disclosure, the polysilicon device layer 110 for MEMS devices is formed by depositing and polishing a polysilicon layer, such that the thickness of the polysilicon device layer 110 is precisely controlled. Moreover, the resistivity of the polysilicon device layer 110 is also precisely controlled by adjusting the doping level of the polysilicon layer during or after the deposition process of forming the polysilicon layer 108. Therefore, the mechanical or electrical performances of the MEMS devices formed of the polysilicon device layer 110 are improved.

Furthermore, according to some embodiments of the present disclosure, the semiconductor substrates for MEMS devices are fabricated without using an SOI wafer. Therefore, the fabrication cost and cycle time of the semiconductor substrates according to some embodiments of the present disclosure are decreased. Moreover, the fabrication flexibility and process parameter control of fabricating the semiconductor substrates of the present disclosure are also enhanced.

In the following paragraphs, methods of fabricating a semiconductor substrate according to alternative embodiments of the present disclosure are disclosed.

Figure 2:
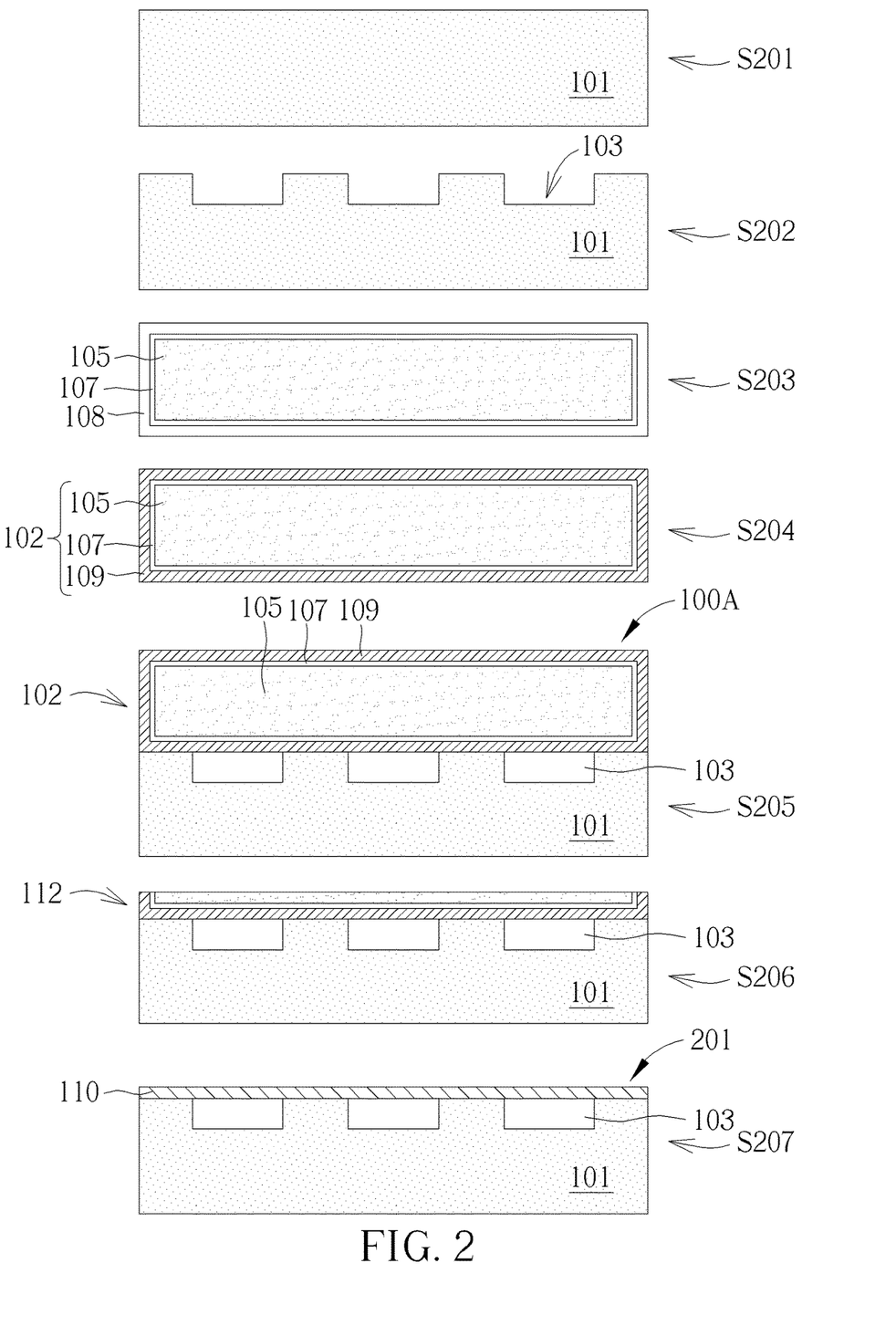
FIG. 2 shows schematic cross-sectional diagrams of several stages of a method of fabricating a semiconductor substrate and treating the semiconductor substrate for MEMS devices according to another embodiment of the present disclosure.

FIG. 2 shows schematic cross-sectional diagrams of several stages of a method of fabricating a semiconductor substrate 100A and treating the semiconductor substrate 100A to form a substrate 201 for MEMS devices according to another embodiment of the present disclosure. In the embodiment of the present disclosure, the details of the first wafer 101 and the formation of the cavities 103 at step S201 and step S202 of FIG. 2 may be the same as those described in the aforementioned descriptions of step S101 and step S102 of FIG. 1, and not repeated herein.

At step S203, in some embodiments, a core substrate 105 such as a Si wafer or silicon-containing wafer is provided, and then a first insulating layer 107 is formed on the front surface, the back surface and the sidewalls of the core substrate 105 to wrap around the core substrate 105. The first insulating layer 107 may be a silicon oxide layer formed by a thermal oxidation or a deposition process. Thereafter, a polysilicon layer 108 is deposited on the first insulating layer 107 and on the front surface, the back surface and the sidewalls of the core substrate 105. The polysilicon layer 108 wraps around the first insulating layer 107 and the core substrate 105. The polysilicon layer 108 may be formed by a CVD process such as an APCVD process, a LPCVD process, or other suitable processes. In some embodiments, the thickness of the deposited polysilicon layer 108 may be from about 2 μm to about 15 μm or thicker.

Afterwards, at step S204, the deposited polysilicon layer 108 is treated by a polishing process to obtain a mirror-polished polysilicon layer 109 that wraps around the first insulating layer 107 and the core substrate 105. In some embodiments, the thickness of the mirror-polished polysilicon layer 109 may be from about 1 μm to about 10 μm. At step S204, in some embodiments, a second wafer 102 includes the core substrate 105, the first insulating layer 107 and the mirror-polished polysilicon layer 109. The first insulating layer 107 and the mirror-polished polysilicon layer 109 wrap around the core substrate 105. The polishing process may adjust the surface roughness of the mirror-polished polysilicon layer 109 and provide a better film quality for a device layer of MEMS devices.

Next, at step S205, the second wafer 102 is bonded with the first wafer 101 to cover the cavities 103, and then the semiconductor substrate 100A is obtained, where the mirror-polished polysilicon layer 109 is disposed between the first insulating layer 107 and the first wafer 101. The semiconductor substrate 100A includes the first wafer 101 having the cavities 103 on the upper surface of the first wafer 101.

The semiconductor substrate 100A further includes the second wafer 102 bonded with the first wafer 101 to cover the cavities 103. In one embodiment, the second wafer 102 includes the core substrate 105, the polysilicon layer 109 wrapping around the core substrate 105, and the first insulating layer 107 disposed between the core substrate 105 and the polysilicon layer 109. The first insulating layer 107 wraps around the core substrate 105 and may be formed of silicon oxide, silicon nitride, silicon oxynitride or a combination thereof. In some embodiments, the first insulating layer 107 is a silicon oxide layer formed by thermal oxidation of the core substrate 105. The first insulating layer 107 is formed to cover the front surface, the back surface and the sidewalls of the core substrate 105. Moreover, in some embodiments of the present disclosure, the polysilicon layer 109 is also called a mirror-polished polysilicon layer and wraps around the first insulating layer 107 and the core substrate 105. The mirror-polished polysilicon layer 109 has a lower surface roughness than that of a deposited polysilicon layer, i.e., the polysilicon layer 108 described above, thereby providing a device layer with better film quality for MEMS devices. In some embodiments, the thickness of the mirror-polished polysilicon layer 109 may be from about 1 µm to about 10 µm. The polysilicon layer 109 is formed on the first insulating layer 107 to cover the front surface, the back surface and the sidewalls of the core substrate 105.

Thereafter, at step S206, the semiconductor substrate 100A is treated to remove some portions of the second wafer 102. At this process stage, a portion of the core substrate 105, a portion of the first insulating layer 107 and a portion of the mirror-polished polysilicon layer 109 are remained on the first wafer 101 to be an intermediate structure 112. Subsequently, at step S207, the intermediate structure 112 is treated to completely remove the core substrate 105 and the first insulating layer 107. In some embodiments, the core substrate 105, the first insulating layer 107 and the mirror-polished polysilicon layer 109 may be removed by a BG process or a CMP process. As a result, the lower portion of the mirror-polished polysilicon layer 109 is remained on the first wafer 101 to be a polysilicon device layer 110 covering the cavities 103, and then a substrate 201 is obtained for fabricating MEMS devices.

Figure 3:
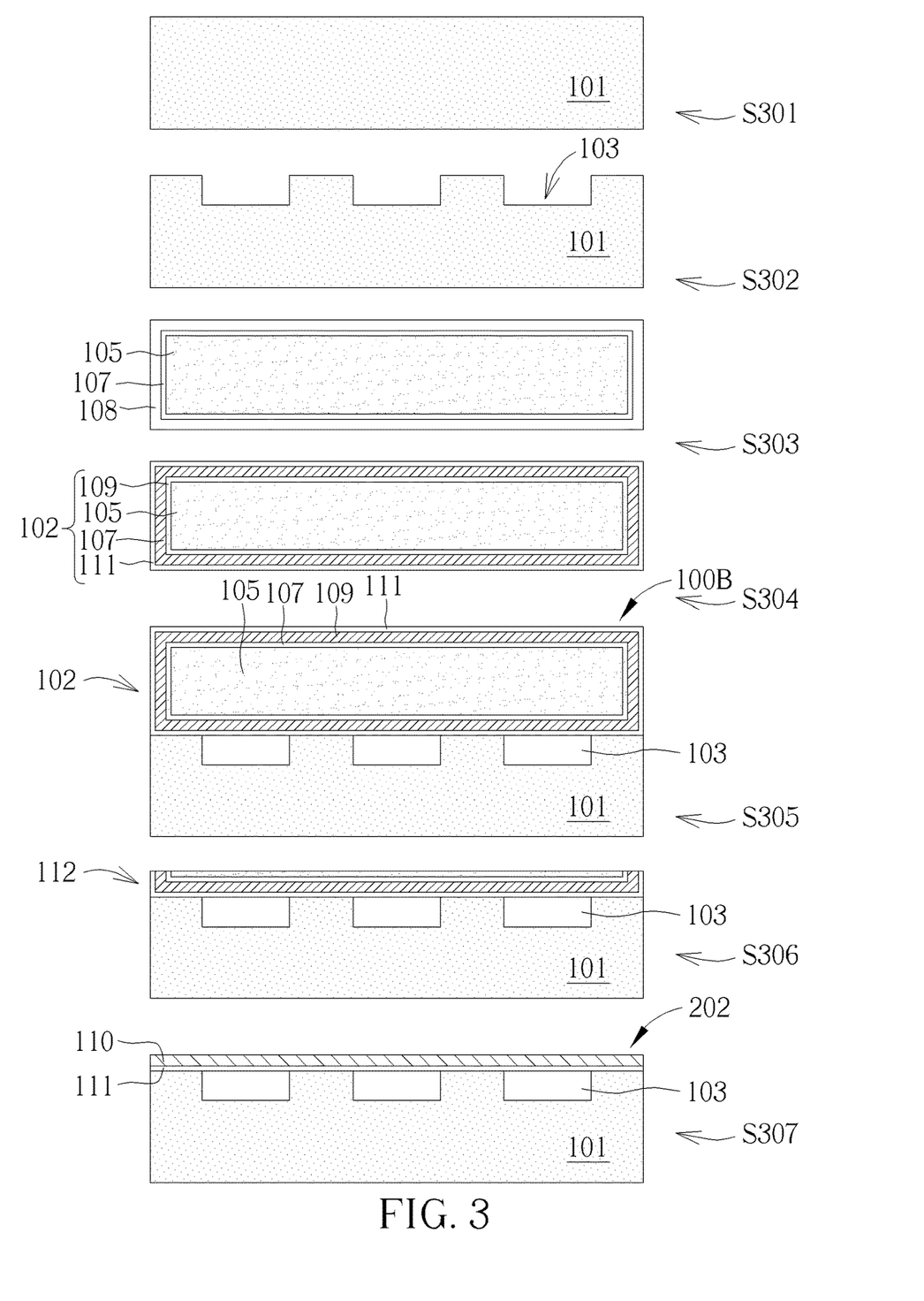
FIG. 3 shows schematic cross-sectional diagrams of several stages of a method of fabricating a semiconductor substrate and treating the semiconductor substrate for MEMS devices according to another embodiment of the present disclosure.

FIG. 3 shows schematic cross-sectional diagrams of several stages of a method of fabricating a semiconductor substrate 100B and treating the semiconductor substrate 100B to form a substrate 202 for MEMS devices according to another embodiment of the present disclosure. The details of the first wafer 101 and the formation of the cavities 103 at step S301 and step S302 of FIG. 3 may be the same as those described in the aforementioned descriptions of step S101 and step S102 of FIG. 1, and not repeated herein. The details of the core substrate 105, the first insulating layer 107 and the deposited polysilicon layer 108 at step S303 of FIG. 3 may be the same as those described in the aforementioned descriptions of step S203 of FIG. 2, and not repeated herein.

Next, at step S304, the deposited polysilicon layer 108 is treated by a polishing process to obtain a mirror-polished polysilicon layer 109 that wraps around the first insulating layer 107 and the core substrate 105. In some embodiments, the thickness of the mirror-polished polysilicon layer 109 may be from about 1 µm to about 10 µm. Thereafter, a second insulating layer 111 is formed on the mirror-polished polysilicon layer 109 to wrap around the mirror-polished polysilicon layer 109, the first insulating layer 107 and the core substrate 105. At step S304, in some embodiments, a second wafer 102 includes the core substrate 105, the first insulating layer 107, the mirror-polished polysilicon layer 109 and the second insulating layer 111.

Afterwards, at step S305, the second wafer 102 is bonded with the first wafer 101 to cover the cavities 103, and then the semiconductor substrate 100B is obtained, where the mirror-polished polysilicon layer 109 is disposed between the first insulating layer 107 and the first wafer 101. In addition, the second insulating layer 111 is disposed between the mirror-polished polysilicon layer 109 and the first wafer 101. The semiconductor substrate 100B includes the first wafer 101 having the cavities 103 on the upper surface of the first wafer 101. In addition, the semiconductor substrate 100B further includes the second wafer 102 bonded with the first wafer 101 to cover the cavities 103. The difference between the semiconductor substrate 100B at step S305 of FIG. 3 and the semiconductor substrate 100A at step S205 of FIG. 2 is that the second wafer 102 of the semiconductor substrate 100B further includes the second insulating layer 111 wrapping around the polysilicon layer 109 and disposed between the first wafer 101 and the polysilicon layer 109. The second insulating layer 111 may be formed of silicon oxide, silicon nitride, silicon oxynitride or a combination thereof. In some embodiments, the second insulating layer 111 is a silicon oxide layer formed by thermal oxidation of the polysilicon layer 109. The second insulating layer 111 is formed on the polysilicon layer 109 to cover the front surface, the back surface and the sidewalls of the core substrate 105. Moreover, the second insulating layer 111 may also cover the cavities 103 of the first wafer 101. The other details of the semiconductor substrate 100B may refer to the aforementioned description of the semiconductor substrate 100A, and not repeated herein.

Next, at step S306, the semiconductor substrate 100B is treated to remove some portions of the second wafer 102. At this process stage, a portion of the core substrate 105, a portion of the first insulating layer 107, a portion of the mirror-polished polysilicon layer 109 and a portion of the second insulating layer 111 are remained on the first wafer 101 to be an intermediate structure 112.

Subsequently, at step S307, the intermediate structure 112 is treated to completely remove the core substrate 105 and the first insulating layer 107. In some embodiments, the core substrate 105, the first insulating layer 107, the mirror-polished polysilicon layer 109 and the second insulating layer 111 may be removed by a BG process or a CMP process. As a result, the lower portion of the mirror-polished polysilicon layer 109 and the lower portion of the second insulating layer 111 are remained on the first wafer 101 to cover the cavities 103, and then a substrate 202 is obtained for fabricating MEMS devices. The remained portion of the mirror-polished polysilicon layer 109 on the first wafer 101 is used as a polysilicon device layer 110 of the MEMS devices. The remained portion of the second insulating layer 111 is disposed between the polysilicon device layer 110 and the first wafer 101.

Figure 4:
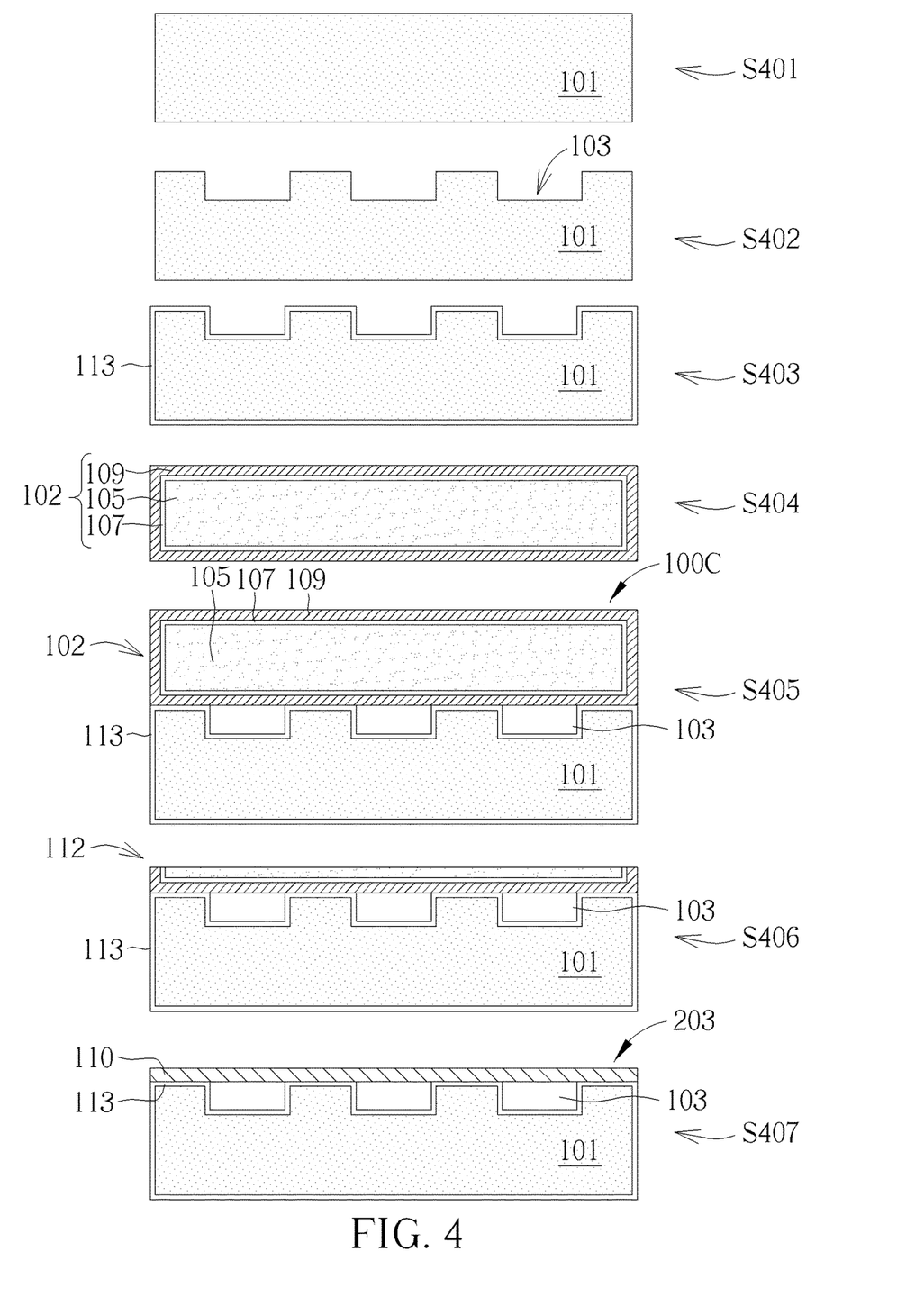
FIG. 4 shows schematic cross-sectional diagrams of several stages of a method of fabricating a semiconductor substrate and treating the semiconductor substrate for MEMS devices according to another embodiment of the present disclosure.

FIG. 4 shows schematic cross-sectional diagrams of several stages of a method of fabricating a semiconductor substrate 100C and treating the semiconductor substrate 100C to form a substrate 203 for MEMS devices according to another embodiment of the present disclosure. The details of the first wafer 101 and the formation of the cavities 103 at step S401 and step S402 of FIG. 4 may be the same as those described in the aforementioned descriptions of step S101 and step S102 of FIG. 1, and not repeated herein.

Subsequently, at step S403, in some embodiments, an adhesion layer 113 is formed to wrap around the first wafer 101 and is also conformally formed on the sidewalls and the bottom surfaces of the cavities 103. The adhesion layer 113 may be a silicon oxide layer formed by a thermal oxidation or a deposition process.

Next, at step S404, in some embodiments, a core substrate 105 such as a Si wafer or silicon-containing wafer is provided. Subsequently, a first insulating layer 107 is formed on the front surface, the back surface and the sidewalls of the core substrate 105 to wrap around the core substrate 105. The first insulating layer 107 may be a silicon oxide layer formed by a thermal oxidation or a deposition process. Thereafter, a polysilicon layer is deposited on the first insulating layer 107 to wrap around the first insulating layer 107 and the core substrate 105. The deposited polysilicon layer is then treated by a polishing process to obtain a mirror-polished polysilicon layer 109 that wraps around the first insulating layer 107 and the core substrate 105. In some embodiments, the thickness of the mirror-polished polysilicon layer 109 may be from about 1 μm to about 10 μm. At step S404, in some embodiments, a second wafer 102 includes the core substrate 105, the first insulating layer 107 and the mirror-polished polysilicon layer 109. Both the first insulating layer 107 and the mirror-polished polysilicon layer 109 wrap around the core substrate 105. The mirror polishing process may adjust the surface roughness of the mirror-polished polysilicon layer 109 and provide a better film quality for a device layer of MEMS devices.

Thereafter, at step S405, the second wafer 102 is bonded with the first wafer 101 to cover the cavities 103, and then the semiconductor substrate 100C is obtained, where the mirror-polished polysilicon layer 109 is disposed between the first insulating layer 107 and the first wafer 101. In addition, the mirror-polished polysilicon layer 109 is disposed between the first insulating layer 107 and the adhesion layer 113. Fusion bonding takes place at the contact surface of the adhesion layer 113 and the cavities 103, and also take place at the contact surface of the adhesion layer 113 and the mirror-polished polysilicon layer 109, which increasing the adhesion of the mirror-polished polysilicon layer 109.

The semiconductor substrate 100C includes the first wafer 101 having the cavities 103 on the upper surface of the first wafer 101. In addition, the semiconductor substrate 100C further includes the second wafer 102 bonded with the first wafer 101 to cover the cavities 103. The difference between the semiconductor substrate 100C at step S405 of FIG. 4 and the semiconductor substrate 100A at step S205 of FIG. 2 is that the semiconductor substrate 100C further includes an adhesion layer 113 wrapping around the first wafer 101 and conformally disposed on the sidewalls and the bottom surfaces of the cavities 103. The adhesion layer 113 may be formed of silicon oxide, silicon nitride, silicon oxynitride or a combination thereof. In some embodiments, the adhesion layer 113 is a silicon oxide layer formed by thermal oxidation of the first wafer 101. The adhesion layer 113 is formed on the upper surface, the bottom surface and the sidewalls of the first wafer 101 and on the sidewalls and the bottom surface of each cavity 103. The other details of the semiconductor substrate 100C may refer to the aforementioned description of the semiconductor substrate 100A, and not repeated herein.

Next, at step S406, the semiconductor substrate 100C is treated to remove some portions of the second wafer 102. At this process stage, a portion of the core substrate 105, a portion of the first insulating layer 107 and a portion of the mirror-polished polysilicon layer 109 are remained on the first wafer 101 to be an intermediate structure 112.

Subsequently, at step S407, the intermediate structure 112 is treated to completely remove the core substrate 105 and the first insulating layer 107. In some embodiments, the core substrate 105, the first insulating layer 107 and the mirror-polished polysilicon layer 109 may be removed by a BG process or a CMP process. As a result, the lower portion of the mirror-polished polysilicon layer 109 is remained on the first wafer 101 to be a polysilicon device layer 110, and then a substrate 203 is obtained for fabricating MEMS devices. The substrate 203 includes the polysilicon device layer 110, the adhesion layer 113 and the first wafer 101. The polysilicon device layer 110 covers the cavities 103 of the first wafer 101. The adhesion layer 113 is disposed between the polysilicon device layer 110 and the first wafer 101, and is conformally disposed on the sidewalls and the bottom surfaces of the cavities 103 and also wraps around the first wafer 101.

Figure 5:
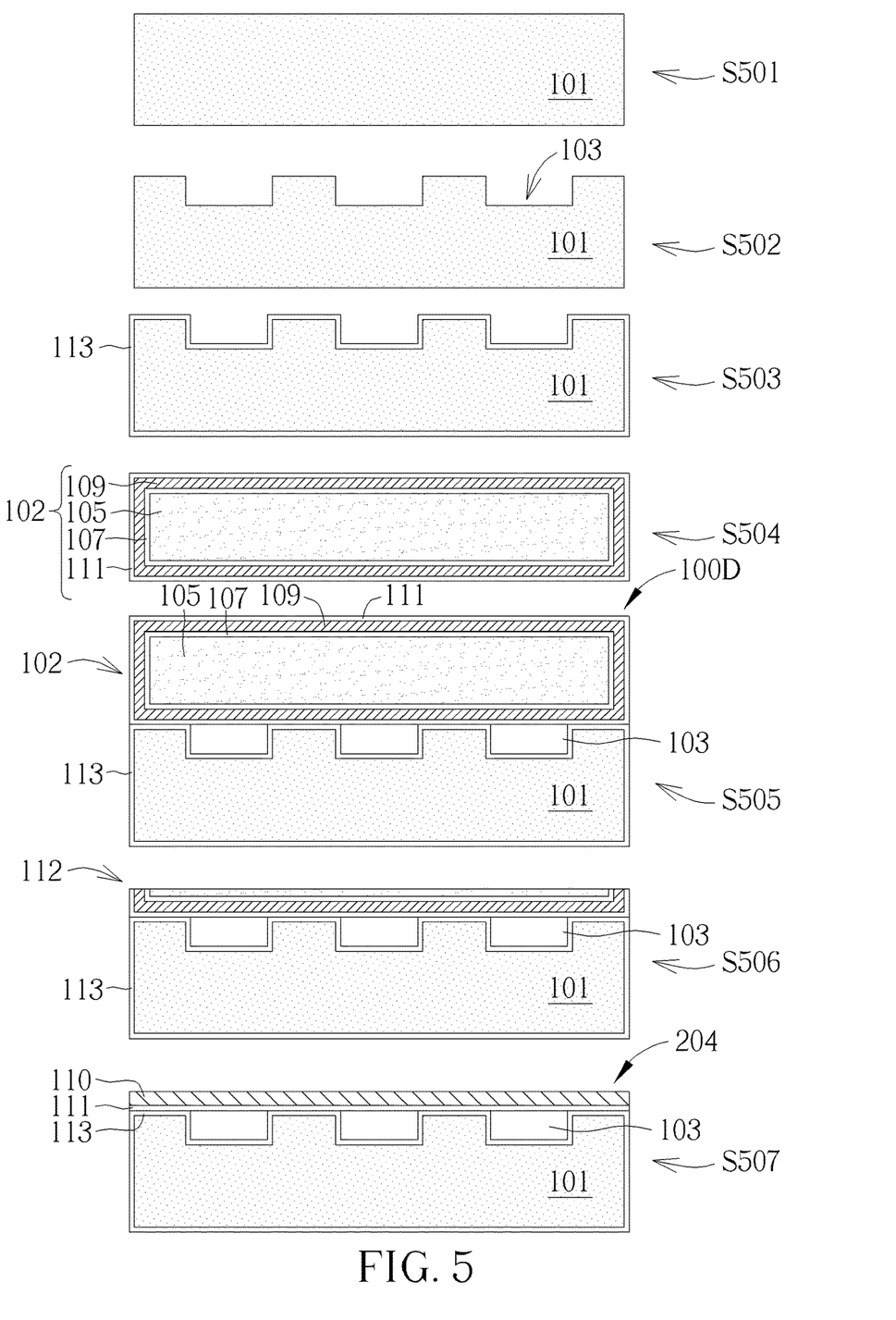
FIG. 5 shows schematic cross-sectional diagrams of several stages of a method of fabricating a semiconductor substrate and treating the semiconductor substrate for MEMS devices according to another embodiment of the present disclosure.

FIG. 5 shows schematic cross-sectional diagrams of several stages of a method of fabricating a semiconductor substrate 100D and treating the semiconductor substrate 100D to form a substrate 204 for MEMS devices according to another embodiment of the present disclosure. The details of the first wafer 101 and the formation of the cavities 103 at step S501 and step S502 of FIG. 5 may be the same as those described in the aforementioned descriptions of step S101 and step S102 of FIG. 1, and not repeated herein. In addition, the details of forming the adhesion layer 113 at step S503 of FIG. 5 may be the same as those described in the aforementioned descriptions of step S403 of FIG. 4, and not repeated herein.

Next, at step S504, in some embodiments, a core substrate 105 such as a Si wafer or silicon-containing wafer is provided. Subsequently, a first insulating layer 107 is formed on the front surface, the back surface and the sidewalls of the core substrate 105 to wrap around the core substrate 105. The first insulating layer 107 may be a silicon oxide layer formed by a thermal oxidation or a deposition process. Thereafter, a polysilicon layer is deposited on the first insulating layer 107 to wrap around the first insulating layer 107 and the core substrate 105. The deposited polysilicon layer is then treated by a polishing process to obtain a mirror-polished polysilicon layer 109 that wraps around the first insulating layer 107 and the core substrate 105. In some embodiments, the thickness of the mirror-polished polysilicon layer 109 may be from about 1 μm to about 10 μm. Subsequently, a second insulating layer 111 is formed on the mirror-polished polysilicon layer 109 to wrap around the mirror-polished polysilicon layer 109, the first insulating layer 107 and the core substrate 105. At step S504, in some embodiments, a second wafer 102 includes the core substrate 105, the first insulating layer 107, the mirror-polished polysilicon layer 109 and the second insulating layer 111. The mirror polishing process may adjust the surface roughness of the mirror-polished polysilicon layer 109 and provide a better film quality for a device layer of MEMS devices.

Thereafter, at step S505, the second wafer 102 is bonded with the first wafer 101 to cover the cavities 103, and then the semiconductor substrate 100D is obtained, where the mirror-polished polysilicon layer 109 is disposed between the first insulating layer 107 and the first wafer 101. In addition, the mirror-polished polysilicon layer 109 is disposed between the first insulating layer 107 and the second insulating layer 111. Moreover, the second insulating layer 111 is disposed between the mirror-polished polysilicon layer 109 and the adhesion layer 113.

The semiconductor substrate 100D includes the first wafer 101 having the cavities 103 on the upper surface of the first wafer 101. In addition, the semiconductor substrate 100D further includes the second wafer 102 bonded with the first wafer 101 to cover the cavities 103. The difference between the semiconductor substrate 100D at step S505 of FIG. 5 and the semiconductor substrate 100C at step S405 of FIG. 4 is that the second wafer 102 of the semiconductor substrate 100D further includes the second insulating layer 111 wrapping around the polysilicon layer 109 and disposed between the first wafer 101 and the polysilicon layer 109. The second insulating layer 111 is also disposed between the polysilicon layer 109 and the adhesion layer 113. The other details of the semiconductor substrate 100D may refer to the aforementioned descriptions of the semiconductor substrate 100B and the semiconductor substrate 100A, and not repeated herein.

Afterwards, at step S506, the semiconductor substrate 100D is treated to remove some portions of the second wafer 102. At this process stage, a portion of the core substrate 105, a portion of the first insulating layer 107, a portion of the mirror-polished polysilicon layer 109 and a portion of the second insulating layer 111 are remained on the first wafer 101 to be an intermediate structure 112.

Next, at step S507, the intermediate structure 112 is treated to completely remove the core substrate 105 and the first insulating layer 107. In some embodiments, the core substrate 105, the first insulating layer 107, the mirror-polished polysilicon layer 109 and the second insulating layer 111 may be removed by a BG process or a CMP process. As a result, the lower portion of the mirror-polished polysilicon layer 109 and the lower portion of the second insulating layer 111 are remained on the first wafer 101 to cover the cavities 103, and then a substrate 204 is obtained for fabricating MEMS devices. The remained portion of the mirror-polished polysilicon layer 109 on the first wafer 101 is used as a polysilicon device layer 110 of the MEMS devices. The remained portion of the second insulating layer 111 is disposed between the polysilicon device layer 110 and the adhesion layer 113 on the first wafer 101. The substrate 204 includes the polysilicon device layer 110, the second insulating layer 111, the adhesion layer 113 and the first wafer 101. The polysilicon device layer 110 and the second insulating layer 111 cover the cavities 103 of the first wafer 101. The adhesion layer 113 is disposed between the second insulating layer 111 and the first wafer 101, and is conformally disposed on the sidewalls and the bottom surfaces of the cavities 103 and also wraps around the first wafer 101.

Figure 6:
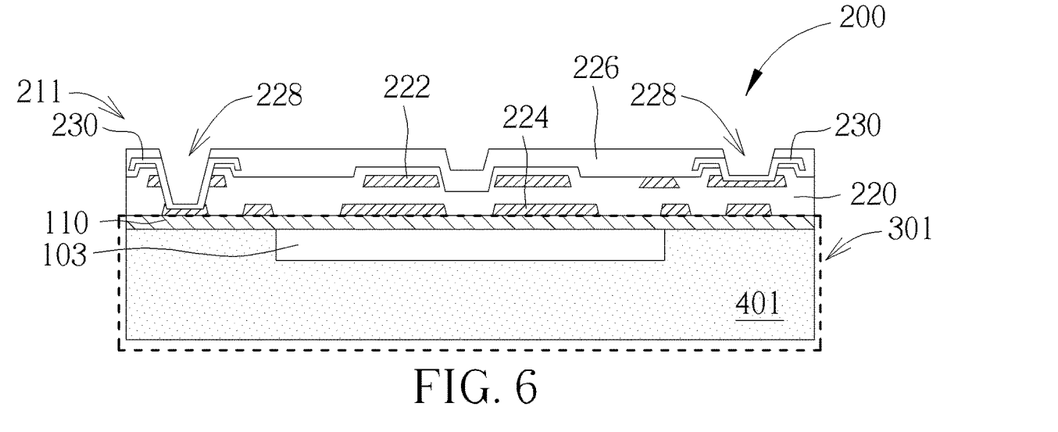
FIG. 6 shows a schematic cross-sectional diagram of a MEMS device according to one embodiment of the present disclosure.
Figure 7:
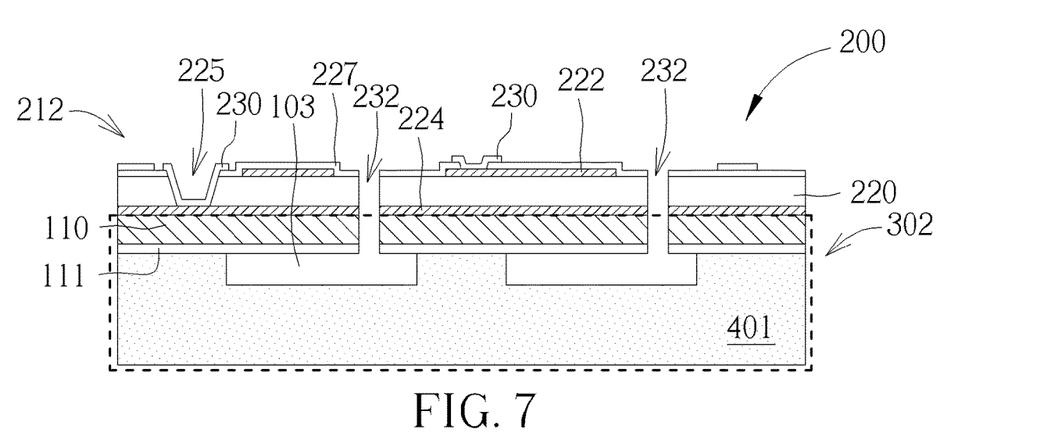
FIG. 7 shows a schematic cross-sectional diagram of a MEMS device according to another embodiment of the present disclosure.
Figure 8:
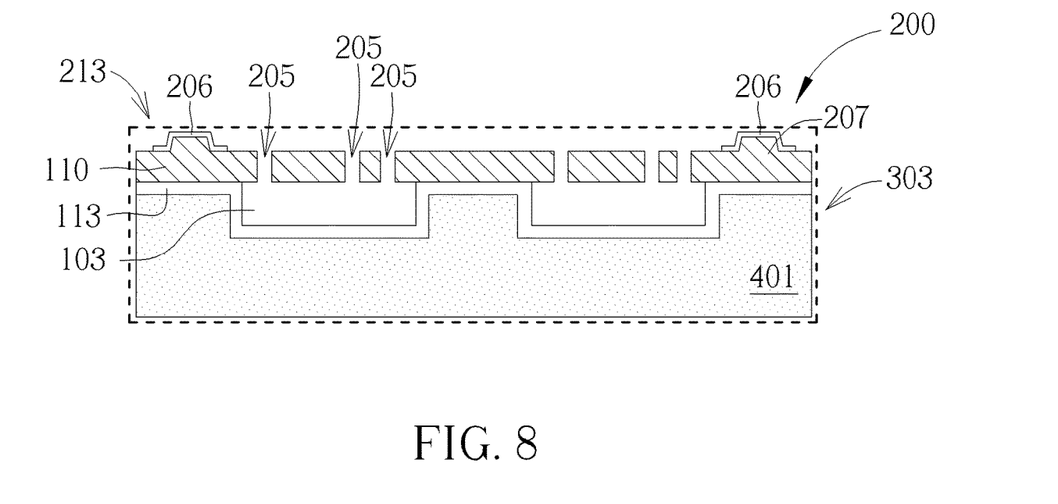
FIG. 8 shows a schematic cross-sectional diagram of a MEMS device according to another embodiment of the present disclosure.

According to some embodiments of the present disclosure, MEMS devices using some of the aforementioned semiconductor substrates are provided. FIG. 6, FIG. 7 and FIG. 8 show schematic cross-sectional diagrams of several MEMS devices 200 according to some embodiments of the present disclosure.

Referring to FIG. 6, a MEMS device 200 fabricated by using the substrate 201 of step S106 in FIG. 1 or the substrate 201 of step S207 in FIG. 2 is provided. As the aforementioned descriptions, a substrate 301 of the MEMS device 200 may be formed from the semiconductor substrate 100 of step S105 in FIG. 1 or the semiconductor substrate 100A of step S205 in FIG. 2. As shown in FIG. 6, the MEMS device 200 includes a singulated wafer 401, a polysilicon device layer 110 and a MEMS structure 211. The singulated wafer 401 is a portion of the first wafer 101 which may be obtained by performing a singulation process on the first wafer 101. The singulated wafer 401 is also referred to as a supporting substrate of the MEMS device 200. The singulated wafer 401 has a cavity 103 on the front surface thereof. The polysilicon device layer 110 is disposed on the front surface of the singulated wafer 401 to cover the cavity 103. The MEMS structure 211 is disposed on the polysilicon device layer 110. In the embodiment, the MEMS structure 211 is a piezoelectric micro-machined ultrasonic transducer (PMUT) that includes a piezoelectric material layer 220 disposed between an upper electrode layer 222 and a lower electrode layer 224. In addition, the MEMS structure 211 further includes a dielectric layer 226 disposed on the piezoelectric material layer 220, the upper electrode layer 222 and the lower electrode layer 224. The dielectric layer 226 has several openings 228 to expose a portion of the lower electrode layer 224 and a portion of the upper electrode layer 222 for electrically connecting to an external circuit (not shown in FIG. 6) through conductive wires 230. During the operation of the MEMS device 200, the membrane suspended above the cavity 103 may vibrate at a predetermined frequency which is partly affected by the thickness and the elasticity of the polysilicon device layer 110.

Referring to FIG. 7, a MEMS device 200 fabricated by using the substrate 202 of step S307 in FIG. 3 is provided. As the aforementioned descriptions, a substrate 302 of the MEMS device 200 may be formed from the semiconductor substrate 100B of step S305 in FIG. 3. As shown in FIG. 7, the MEMS device 200 includes a singulated wafer 401, a polysilicon device layer 110, a second insulating layer 111 and a MEMS structure 212. The singulated wafer 401 has several cavities 103 on the front surface thereof. Although FIG. 7 shows two cavities 103, the singulated wafer 401 may have one or more than two cavities 103. The second insulating layer 111 is disposed between the polysilicon device layer 110 and the singulated wafer 401. The MEMS structure 212 is disposed on the polysilicon device layer 110. In the embodiment, the MEMS structure 212 is a MEMS resonator and filters. The MEMS structure 212 includes a piezoelectric material layer 220 disposed between an upper electrode layer 222 and a lower electrode layer 224. The piezoelectric material layer 220 has an opening 225 to expose a portion of the lower electrode layer 224. A conductive wire 230 is conformally disposed on the sidewalls and the bottom of the opening 225 for electrically connecting the lower electrode layer 224 to an external circuit (not shown in FIG. 7). A protection layer 227 is disposed on the upper electrode layer 222 and has an opening to expose a portion of the upper electrode layer 222. Another conductive wire 230 is disposed on the portion of the upper electrode layer 222 for electrically connecting to the external circuit (not shown in FIG. 7). In addition, the MEMS structure 212, the polysilicon device layer 110 and the second insulating layer 111 may be patterned together to form several through holes 232 that are connected with the cavities 103 of the singulated wafer 401. During the operation of the MEMS device 200, the membrane suspended above the cavity 103 may vibrate at a predetermined resonance frequency which is partly affected by the thickness and the elasticity of the polysilicon device layer 110.

Referring to FIG. 8, a MEMS device 200 fabricated by using the substrate 203 of step S407 in FIG. 4 is provided. As the aforementioned descriptions, a substrate 303 of the MEMS device 200 may be formed from the semiconductor substrate 100C of step S405 in FIG. 4. As shown in FIG. 8, the MEMS device 200 includes a singulated wafer 401, a polysilicon device layer 110, an adhesion layer 113 and a MEMS structure 213, where the MEMS structure 213 is formed from the polysilicon device layer 110 and the singulated wafer 401 has several cavities 103 on the front surface thereof. After the MEMS structure 213 is formed, the substrate 203 of step S407 in FIG. 4 is thinned from backside and then diced into several pieces. Therefore, as shown in FIG. 8, the adhesion layer 113 is conformally disposed on the front surface of the singulated wafer 401 and the sidewalls and the bottom surfaces of the cavities 103. The polysilicon device layer 110 is disposed on the adhesion layer 113. In the embodiment, the MEMS structure 213 is a MEMS accelerometer and gyroscope which is formed by patterning the polysilicon device layer 110 to form multiple protruding portions 207 and multiple through holes 205 that are connected with the cavities 103 of the singulated wafer 401. In addition, the MEMS structure 213 further includes several conductive wires 206 formed on the protruding portions 207 of the patterned polysilicon device layer 110. In a case where the MEMS device 200 is an accelerometer or gyroscope, a portion of the polysilicon device layer 110 suspended over the cavity 103 may function as a movable proof mass. During the operation of the MEMS device 200, the movable proof mass may be displaced from its original place when an external force is applied to the MEMS device 200. The degree of the displacement of the movable proof mass is partly affected by the mass of the movable proof mass formed from the polysilicon device layer 110.

The MEMS structures and the substrates of the MEMS devices 200 as shown in FIG. 6, FIG. 7, and FIG. 8 are illustrated for examples, but not limited thereto. The MEMS structures of the MEMS devices 200 include a MEMS resonator and filters, a capacitive micro-machined ultrasonic transducer (CMUT), a piezoelectric micro-machined ultrasonic transducer (PMUT), a MEMS accelerometer, a MEMS gyroscope, inertial sensors, pressure sensors, micro-fluidic devices, other micro devices or a combination thereof. Moreover, the substrates of the MEMS devices 200 may be taken from any one of the semiconductor substrates of the embodiments of the present disclosure.

According to the embodiments of the present disclosure, the second wafers of the semiconductor substrates provide a polysilicon device layer for fabricating MEMS devices. The polysilicon device layer of the MEMS devices is formed by depositing and mirror-polishing a polysilicon layer, such that the polysilicon device layer has a precise thickness control to improve the performances of the MEMS devices. Moreover, the resistivity of the polysilicon device layer is precisely controlled by adjusting the doping level of the polysilicon layer. Therefore, the electrical performances of the MEMS devices using the polysilicon device layer are also enhanced.

In addition, according to the embodiments of the present disclosure, the semiconductor substrates for MEMS devices are fabricated without using an SOI wafer. Therefore, the fabrication of the semiconductor substrates of the present disclosure is less time-consuming and less cost than the conventional substrates of MEMS devices fabricated by using an SOI wafer.

Moreover, according to the embodiments of the present disclosure, the thickness of the polysilicon device layer and the dimensions of the cavities are adjusted based on the requirements of the MEMS devices during the fabrication of the semiconductor substrates. Therefore, the fabrication of the semiconductor substrates of the present disclosure has good process parameter control and more fabrication flexibility than the conventional substrates of MEMS devices fabricated by using an SOI wafer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A micro-electro-mechanical system (MEMS) device, comprising:
a supporting substrate, having a cavity on an upper surface and the cavity not penetrating through the supporting substrate;
an adhesion layer conformally disposed on the upper surface of the supporting substrate and sidewalls and the bottom surface of the cavity;
a polysilicon device layer, disposed on the upper surface of the supporting substrate to cover the cavity, wherein a composition of the polysilicon device layer is polysilicon and is different from a composition of the adhesion layer; and
a MEMS structure, disposed on the polysilicon device layer.

2. The MEMS device of claim 1, further comprising an insulating layer disposed between the polysilicon device layer and the adhesion layer.

3. The MEMS device of claim 1, wherein the MEMS structure comprises a MEMS resonator and filters, a capacitive micro-machined ultrasonic transducer (CMUT), a piezoelectric micro-machined ultrasonic transducer (PMUT), a MEMS accelerometer, a MEMS gyroscope or a combination thereof.

4. A semiconductor substrate, comprising:
a first wafer, having a plurality of cavities on an upper surface, wherein bottom surfaces of the plurality of cavities are higher than a bottom surface of the supporting substrate; and
a second wafer, bonded with the first wafer to cover the plurality of cavities, wherein the second wafer comprises:
a core substrate;
a polysilicon layer wrapping around the core substrate; and
a first insulating layer disposed between the core substrate and the polysilicon layer.

5. The semiconductor substrate of claim 4, wherein the first insulating layer wraps around the core substrate.

6. The semiconductor substrate of claim 4, further comprising a second insulating layer wrapping around the polysilicon layer and disposed between the first wafer and the polysilicon layer.

7. The semiconductor substrate of claim 4, further comprising an adhesion layer wrapping around the first wafer and conformally disposed on sidewalls and the bottom surfaces of the plurality of cavities.

8. The semiconductor substrate of claim 7, further comprising a second insulating layer wrapping around the polysilicon layer, and disposed between the adhesion layer and the polysilicon layer.

9. The semiconductor substrate of claim 8, wherein the first insulating layer, the second insulating layer and the adhesion layer comprise silicon oxide.

10. The semiconductor substrate of claim 4, wherein the polysilicon layer is a mirror-polished polysilicon layer, the first wafer and the core substrate of the second wafer comprise silicon, and the first insulating layer comprises silicon oxide.

11. The MEMS device of claim 1, wherein the polysilicon device layer comprises:
a plurality of protruding portions; and a plurality of through holes that are connected with the cavity.

\* \* \* \* \*